United States Patent
Diep et al.

(10) Patent No.: US 8,980,676 B2
(45) Date of Patent: Mar. 17, 2015

(54) FABRICATION OF WINDOW CAVITY CAP STRUCTURES IN WAFER LEVEL PACKAGING

(75) Inventors: Buu Diep, Murphy, TX (US); Stephen H. Black, Buellton, CA (US)

(73) Assignee: Raytheon Company, Waltham, MA (US)

(*) Notice: Subject to any disclaimer, the term of this patent is extended or adjusted under 35 U.S.C. 154(b) by 185 days.

(21) Appl. No.: 13/532,180

(22) Filed: Jun. 25, 2012

(65) Prior Publication Data
US 2013/0344638 A1 Dec. 26, 2013

(51) Int. Cl.
| | |
|---|---|
| H01L 21/00 | (2006.01) |
| G01J 5/02 | (2006.01) |
| G01J 5/04 | (2006.01) |
| G01J 5/20 | (2006.01) |
| H01L 31/0203 | (2014.01) |
| H01L 31/09 | (2006.01) |

(52) U.S. Cl.
CPC ............... *G01J 5/0235* (2013.01); *G01J 5/024* (2013.01); *G01J 5/045* (2013.01); *G01J 5/20* (2013.01); *G01J 2005/202* (2013.01); *H01L 31/0203* (2013.01); *H01L 31/09* (2013.01)
USPC ........ 438/66; 438/110; 438/113; 257/E31.11; 216/13; 216/17; 216/20; 216/21

(58) Field of Classification Search
CPC ......... H01L 31/02; H01L 21/50; H01L 23/12; H01L 21/00; H01L 23/00; H05K 7/02
USPC ............ 438/66, 110, 113; 216/13, 17, 20, 21; 257/E31.11; 136/153
See application file for complete search history.

(56) References Cited

U.S. PATENT DOCUMENTS

| | | | |
|---|---|---|---|
| 5,470,761 A * | 11/1995 | McKee et al. | 438/66 |
| 6,255,741 B1 * | 7/2001 | Yoshihara et al. | 257/792 |
| 6,352,935 B1 | 3/2002 | Collins et al. | |
| 6,929,974 B2 * | 8/2005 | Ding et al. | 438/106 |
| 7,361,284 B2 | 4/2008 | Chen | |
| 7,405,101 B2 * | 7/2008 | Rhodes | 438/69 |
| 7,422,962 B2 * | 9/2008 | Chen et al. | 438/456 |
| 7,510,947 B2 | 3/2009 | Shao et al. | |
| 7,547,571 B2 * | 6/2009 | Chen et al. | 438/64 |
| 7,561,284 B2 | 7/2009 | Yahagi | |

(Continued)

FOREIGN PATENT DOCUMENTS

WO 2009070348 A1 6/2009

OTHER PUBLICATIONS

Youngjae Lee, et al., "Lithography-Free Fabrication of Large Area Subwavelength Antireflection Structures Using Thermally Dewetted Pt/Pd Alloy Etch Mask," Nanoscale Res Lett, 4: pp. 364-370, 2009.

(Continued)

*Primary Examiner* — Caleb Henry
(74) *Attorney, Agent, or Firm* — Cantor Colburn LLP

(57) ABSTRACT

A method of forming a window cap wafer (WCW) structure for semiconductor devices includes machining a plurality of cavities into a front side of a first substrate; bonding the first substrate to a second substrate, at the front side of the first substrate; removing a back side of the first substrate so as to expose the plurality of cavities, thereby defining the WCW structure comprising the second substrate and a plurality of vertical supports comprised of material of the first substrate.

16 Claims, 3 Drawing Sheets

(56) References Cited

U.S. PATENT DOCUMENTS

| | | | |
|---|---|---|---|
| 7,598,125 B2 | 10/2009 | Shao et al. | |
| 7,824,965 B2 | 11/2010 | Fryklund et al. | |
| 7,952,189 B2* | 5/2011 | Wan | 257/704 |
| 8,017,443 B2* | 9/2011 | Shiraishi | 438/116 |
| 8,324,024 B2* | 12/2012 | Leib et al. | 438/110 |
| 2003/0089394 A1* | 5/2003 | Chang-Chien et al. | 137/14 |
| 2004/0029360 A1* | 2/2004 | Geefay et al. | 438/459 |
| 2005/0054212 A1 | 3/2005 | Syllaios et al. | |
| 2005/0191791 A1* | 9/2005 | Hartwell et al. | 438/109 |
| 2005/0253213 A1 | 11/2005 | Jiang et al. | |
| 2005/0263866 A1* | 12/2005 | Wan | 257/678 |
| 2008/0290435 A1* | 11/2008 | Oliver et al. | 257/432 |
| 2009/0029500 A1* | 1/2009 | Wan | 438/51 |
| 2009/0321863 A1* | 12/2009 | Borthakur et al. | 257/432 |
| 2009/0321867 A1* | 12/2009 | Leib et al. | 257/434 |
| 2011/0189808 A1* | 8/2011 | Watanabe et al. | 438/66 |
| 2011/0207257 A1* | 8/2011 | Watanabe | 438/66 |
| 2011/0215443 A1* | 9/2011 | Hayasaka et al. | 257/621 |
| 2012/0012994 A1* | 1/2012 | Von Koblinski et al. | 257/680 |
| 2012/0267773 A1* | 10/2012 | Ebefors et al. | 257/692 |

OTHER PUBLICATIONS

Frank Niklaus, et al., "MEMS-Based Uncooled Infrared Bolometer Arrays—A Review," Invited Paper, MEMS/MOEMS Technologies and Applications III, Proc. of SPIE vol. 6836, 68360D, pp. 1-15, 2007.

Zhaoning Yu, et al., "Fabrication of Large Area Subwavelength Antireflection Structures on Si Using Trilayer Resist Nanoimprint Lithography and Liftoff," American Vacuum Society, J. Vac. Sci. Technol. B 21? (6), pp. 2874-2877, 2003.

Patent Cooperation Treaty, International Search Report for Application PCT/US13/46283, filed Jun. 18, 2013, mailed Nov. 7, 2013, 6 Pages.

Patent Cooperation Treaty, Written Opinion of the International Searching Authority, for Application PCT/US13/46283, filed Jun. 18, 2013, mailed Nov. 7, 2013, 4 pages.

* cited by examiner

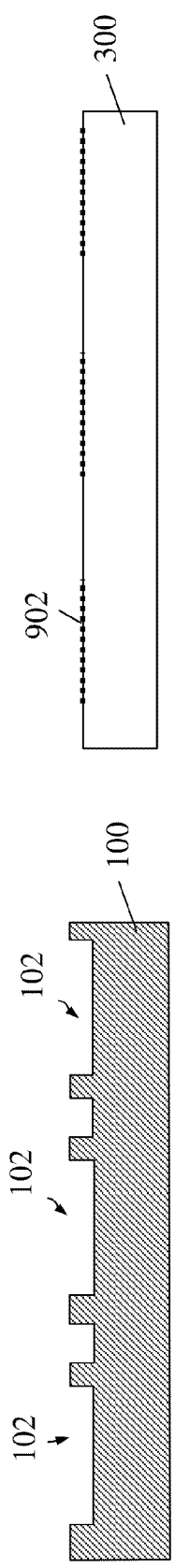
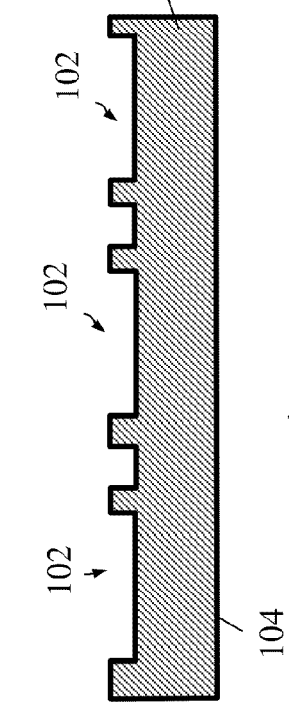
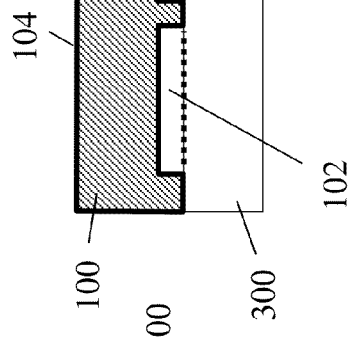
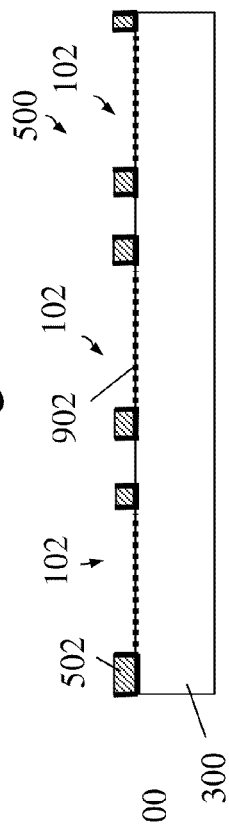
Figure 6
Figure 7
Figure 8
Figure 9
Figure 11
Figure 12

US 8,980,676 B2

FABRICATION OF WINDOW CAVITY CAP STRUCTURES IN WAFER LEVEL PACKAGING

BACKGROUND

The present disclosure relates generally to semiconductor device manufacturing and, more particularly, to fabrication of window cavity cap structures in wafer level packaging of semiconductor devices.

Bolometers are devices that act as thermal infrared (IR) sensors by absorbing electromagnetic radiation and thus increase their temperature. The resulting temperature increase is a function of the radiant energy striking the bolometer and is measured with for example, thermoelectric, pyroelectric, resistive or other temperature sensing principles. In the context of uncooled infrared imaging technologies, an infrared bolometer focal plane array (FPA) typically refers to resistive microbolometers, in which a temperature increase is measured by a corresponding resistance change. More specifically, a microbolometer is a type of resistor used as a detector in a thermal camera, for example. The microbolometer may include a tiny vanadium oxide or amorphous silicon resistor with a large temperature coefficient on a silicon element with large surface area, low heat capacity and good thermal isolation. Infrared radiation from a specific range of wavelengths strikes the vanadium oxide or amorphous silicon and changes its electrical resistance. Changes in scene temperature cause changes in the bolometer temperature, which are converted to electrical signals and processed into an image.

As is the case with certain microelectromechanical (MEMS) devices, bolometers may need to be packaged in vacuum conditions for best performance. Exemplary requirements for the packaging of bolometer arrays include reliable hermetic sealing, the integration of IR window material with good infrared transmission, and high yield/low cost packaging. Both the reliability and the cost of MEMS devices depend upon encapsulation techniques chosen. For MEMS based bolometers, packaging may be done at the chip level or at the wafer level. A common way of packaging in this instance is to fabricate a protective, IR-transmitting cap wafer and bond it to an exposed surface of the semiconductor substrate containing the active areas prior to dicing. The cap wafer is formed with cavities therein such that when the cap wafer is flipped and bonded to the device wafer, the cavities provide sufficient clearance to accommodate and protect the MEMS devices therein.

SUMMARY

In an exemplary embodiment, a method of forming a window cap wafer (WCW) structure for semiconductor devices includes machining a plurality of cavities into a front side of a first substrate; bonding the first substrate to a second substrate, at the front side of the first substrate; removing a back side of the first substrate so as to expose the plurality of cavities, thereby defining the WCW structure comprising the second substrate and a plurality of vertical supports comprised of material of the first substrate.

In another embodiment, a method of forming a window cap wafer (WCW) structure for semiconductor devices includes machining a plurality of cavities into a front side of a first substrate; forming a plurality of sub-wavelength antireflective structured (SAS) arrays on a second substrate; bonding the first substrate to the second substrate, at the front side of the first substrate, wherein locations of the SAS arrays on the second substrate correspond to locations of the cavities in the first substrate; removing a back side of the first substrate so as to expose the plurality of cavities, thereby defining the WCW structure comprising the second substrate and a plurality of vertical supports comprised of material of the first substrate.

BRIEF DESCRIPTION OF THE DRAWINGS

For a more complete understanding of this disclosure, reference is now made to the following brief description, taken in connection with the accompanying drawings and detailed description, wherein like reference numerals represent like parts:

FIGS. 1-5 are a series of cross sectional views illustrating a method of forming a window cap wafer (WCW) for semiconductor devices, in accordance with an exemplary embodiment, in which:

FIG. 1 illustrates a first substrate having a plurality of cavities machined therein;

FIG. 2 illustrates the formation of a thermal oxide on the first substrate of FIG. 1;

FIG. 3 illustrates a second, optical substrate for use in combination with the first substrate;

FIG. 4 illustrates bonding of the first substrate of FIG. 2 to the second, optical substrate of FIG. 3;

FIG. 5 illustrates thinning of the backside of the bonded first substrate of FIG. 4 so as to expose the cavities and form the WCW;

FIGS. 6-9, 11 and 12 are a series of cross sectional views illustrating a method of forming a WCW for semiconductor devices, in accordance with another exemplary embodiment, in which:

FIG. 6 illustrates a first substrate having a plurality of cavities machined therein;

FIG. 7 illustrates the formation of a thermal oxide on the first substrate of FIG. 6;

FIG. 8 illustrates a second, optical substrate for use in combination with the first substrate;

FIG. 9 illustrates the formation of sub-wavelength antireflective structured (SAS) arrays on the second, optical substrate of FIG. 8;

FIG. 11 illustrates bonding of the first substrate of FIG. 7 to the second, optical substrate of FIG. 9;

FIG. 12 illustrates thinning of the backside of the bonded first substrate of FIG. 11 so as to expose the cavities and form the WCW;

DETAILED DESCRIPTION

Figure 1:
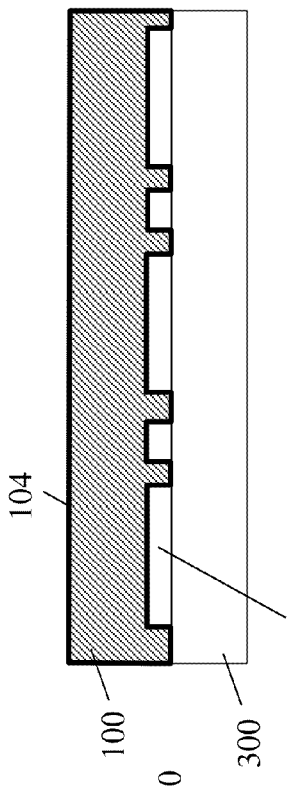

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature(s) being described. Also, the description is not to be considered as limiting the scope of the embodiments described herein.

As indicated above, current wafer level packing (WLP) of MEMS devices such as uncooled bolometer FPAs requires the use of a window cap wafer (WCW) having cavities formed therein to house the MEMS structures. Conventionally, a protective cap wafer of this type is formed using photolithography techniques and deep reactive ion etching (DRIE) of the cap semiconductor materials to form straight walled cavities. More specifically, this type of process flow may involve providing a silicon-on-insulator (SOI) wafer that includes an etch stop layer (i.e., a buried oxide layer or BOX layer) therein. A thermal oxide is grown on an optical handle layer, which is then bonded to a device layer. After grinding of the bonded structure to set cavity depth, a hardmask layer (such as an oxide) is then deposited followed by a photoresist layer. Photolithography techniques are used to pattern the photoresist layer, followed by hardmask etching and etching of the cavities of the cap structure. Finally, a wet etch is used to remove the hardmask layer and BOX layer of the SOI wafer.

A process such as described above is generally lengthy and complex process, having several drawbacks associated therewith. For example, given a relatively slow etch rate for a DRIE process, it can take as long as 5 hours per wafer to etch a 300 micron ($\mu m$) cavity depth, depending on tool and process parameters. Secondly, photolithography processing is also expensive, and the resulting porous surface post-etching is undesirable for high vacuum applications. Furthermore, the isotropic wet etching of the BOX layer of the SOI substrate creates an undercut that is also undesirable for such high vacuum applications.

In addition to cavity formation, for certain optical MEMS applications such as the aforementioned uncooled bolometer FPAs, once the WCW is fabricated, another processing step involves the deposition of an anti-reflective coating (ARC) material in order to minimize transmittance loss. Here, the ARC may include a multi-layered thin film coating, containing materials for IR use such as germanium (Ge), zinc sulfide (ZnS) and zinc selenide (ZnSe). Because some of these materials are not compatible with conventional silicon semiconductor processing, deposition of ARC materials into a window cavity requires additional process steps to remove the coating from the surrounding areas following deposition. Moreover, optical devices operating in the thermal imaging region of the infrared spectrum (e.g., 8-15 $\mu m$ band) require thick layers, thus leading to long deposition times and high cost. Due to their proximity to the image plane, ARC materials are also very defect-sensitive. There are also other inherent issues in ARC formation for WCWs, with respect to adhesion, outgassing, coefficient of thermal expansion (CTE) mismatch, internal stress, and stability of the thin film stack under wafer bonding temperatures.

Accordingly, the embodiments described herein introduce a novel method of forming WCWs for wafer level packaging that eliminates the use of photolithography process to pattern the cap cavities. In brief, deep reactive ion etching (DRIE) is replaced with ultrasonic machining (USM) or other similar machining methods that do not require photolithographic processes to pattern cavities. Rather, USM involves the use of ultrasonic energy coupling with abrasive slurry to perform the machining, and in so doing reduces or minimizes undercut and crevices, thus resulting in a much faster and simpler process flow. In a further exemplary embodiment, as an alternative to thin film AR coatings, sub-wavelength antireflective structures (SAS) can be etched into the WCW in order to achieve a comparable reduction in transmittance loss, without the inherent limitations of conventional multi layered AR thin film coatings.

Figure 2:
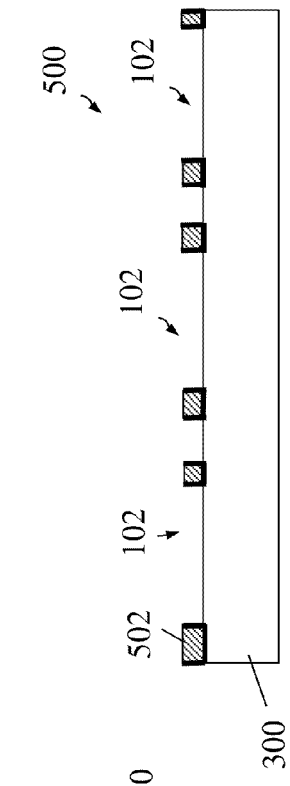

Referring generally to FIGS. 1-5, there is shown a series of cross sectional views illustrating a method of forming a window cap wafer (WCW) for semiconductor devices, in accordance with an exemplary embodiment. In FIG. 1, a first substrate 100 has a plurality of cavities 102 machined into a front side thereof, such as by ultrasonic machining. The first substrate 100 may include a material such as silicon, polysilicon, germanium, glass, or other suitable substrate that may be machined and serves as cavity defining wafer. However, the cavities 102 are defined without lithography and may be machined to a depth that is initially larger than the final intended depth of the cavities for the WCW. For example, the cavities 102 may be on the order of about 350-400 $\mu m$ in depth as initially machined into the first substrate 100. In FIG. 2, an optional oxide layer 104 is formed over outside surfaces of the first substrate 100. The optional oxide layer 104, having an exemplary thickness of about 5000 angstroms (Å), may be formed by a thermal process such as annealing. However, other techniques known in the art may also be used to form the optional oxide layer 104 or other such layer suitable for enhancing substrate-to-substrate bonding. It will be appreciated that other techniques, such as surface activated bonding for example, are also contemplated which may eliminate the need for forming an oxide or other type of layer on the substrate 100.

Figure 3:
Figure 4:
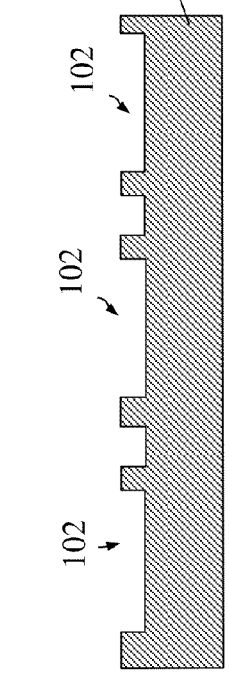

FIG. 3 illustrates an optical substrate 300 that serves as a second substrate in the formation of a WCW. The optical substrate 300 is selected from a material that provides good optical transmission properties (e.g., in the IR or perhaps visible spectra), such as silicon, polysilicon, germanium, glass, etc. As illustrated in FIG. 4, the oxidized, cavity-machined first substrate 100 is flipped and bonded to the second, transmissive optical substrate 300 at the front side of the first substrate 100 such that a back side of the first substrate 100 is exposed and the cavities 102 are interior to the bonded structure.

Figure 5:
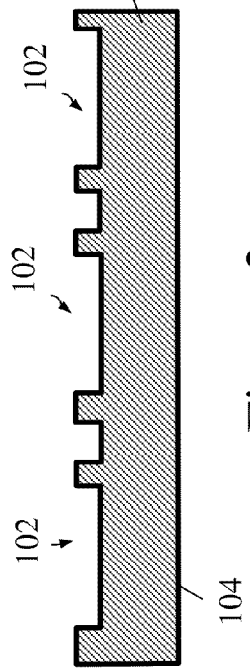

Then, as shown in FIG. 5, the backside of the first substrate is grinded so as to reduce the thickness of the first substrate 100 until the cavities 102 are once again exposed. This results in the formation of vertical supports 502 bonded to the second optical substrate 300, and thereby defining a window cap wafer 500. The cavities 102 may have a final depth corresponding to cavities that are conventionally formed by DRIE of a wafer (e.g., about 300 $\mu m$). Stated another way, the vertical supports 502 may have a height of about 300 $\mu m$. Thus, by initially machining the cavities 102 slightly larger than the final desired cavity dimension in the first substrate 100, this allows for tolerance in grinding the bonded first substrate 100 by allowing some additional material removal once the cavities 102 are exposed. However, in contrast to lithography and DRIE of a wafer, the above technique minimizes crevice formation and wafer layer undercutting.

The above approach in forming a WCW further allows for the replacement of ARC layers with etched sub-wavelength antireflective structured (SAS) arrays. This option is made feasible as a result of using a flat optical substrate instead of an optical substrate having cavities therein. Referring generally to FIGS. 6-12, there is shown a series of cross sectional views illustrating a method of forming a WCW for semiconductor devices, in accordance with another exemplary embodiment. The processes performed in FIGS. 6-8 are substantially similar to those performed in FIG. 1-3 described above, in which a first substrate 100 has a plurality of cavities 102 machined therein, followed by forming an oxide layer 104 is over outside surfaces of the first substrate 100.

In FIG. 8, an optical substrate 300 is again used as a second substrate in the formation of a WCW. However, in this embodiment, the flat optical substrate 300 is also patterned with sub-wavelength antireflective structured (SAS) arrays 902 etched therein, as illustrated in FIG. 9. The SAS arrays 902 are produced in the optical substrate 300 with a pattern that corresponds to the locations of the cavities 102 of the first substrate 100. The specific manner in which the SAS arrays 902 are formed within the optical substrate may be implemented by any suitable technique in the art such as by lithography or lithography-free process flows. Examples of publications outlining such techniques include, but are not limited to, Zhaoning Yu, et al., "Fabrication of large area subwavelength antireflection structures on Si using trilayer resist nanoimprint lithography and liftoff," J. Vac. Sci. Technol. B 21(6), November/December 2003, and Youngjae Lee, et al., "Lithography-Free Fabrication of Large Area Subwavelength Antireflection Structures Using Thermally Dewetted Pt/Pd Alloy Etch Mask," Nanoscale Res Lett (2009), the contents of which are incorporated by reference herein in their entirety.

Figure 10:
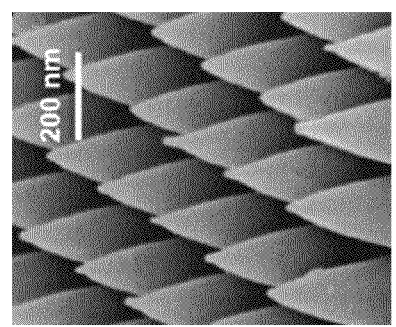
FIG. 10 is a scanning electron microscope (SEM) image of an exemplary SAS array formed on a silicon substrate.

One example of a lithographically patterned SAS array as in the aforementioned Yu, et al. publication is illustrated in FIG. 10, which is a scanning electron microscope (SEM) image of an exemplary SAS array formed on a silicon substrate. In the example depicted, the array structures have a conical profile with a period of about 200 nanometers (nm) and a groove depth of about 520 nm. Such subwavelength structures may be used to create an effective index gradient and reduce surface Fresnel reflection over a broad spectral range and a wide field of view.

Although non-lithographic techniques can also be used, because the optical substrate 300 is flat, high resolution lithography can be used in forming the SAS arrays 902 of FIG. 9. Moreover, as compared to an ARC layer or layers, the SAS will be more durable and can withstand high bonding temperatures.

Referring now to FIG. 11, the oxidized, cavity-machined first substrate 100 is flipped and bonded to the second optical substrate 300 such that a back side of the first substrate 100 is exposed and the cavities 102 are interior to the bonded structure. It will be noted that the location of the cavities corresponds to the location of the SAS arrays 902 formed on the optical substrate. As is the case with the previous embodiment, a grinding process is applied to the back side of the first substrate so as expose the cavities 102, thereby defining a WCW structure 500 as shown in FIG. 12.

Figure 13:
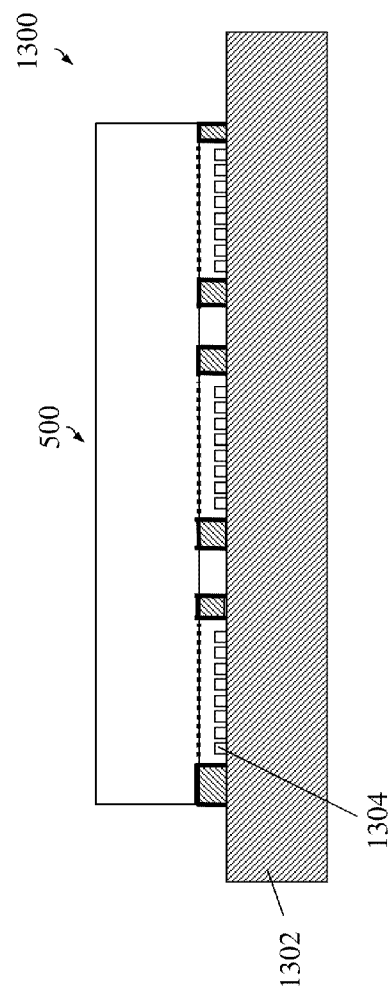
FIG. 13 is a cross sectional view of MEMS-based, uncooled IR bolometer device having a WCW, in accordance with another exemplary embodiment.

An exemplary application for a WCW structure, such as those formed in accordance with the above described embodiment is illustrated in FIG. 13. More specifically, FIG. 13 is a cross sectional view of MEMS-based, uncooled IR bolometer device 1300 having a WCW 500, in accordance with another exemplary embodiment. In the illustrated example, the WCW 500 includes the optional SAS arrays 902 as depicted in FIG. 12. The WCW 500 is shown bonded to a bolometer substrate wafer 1302. The cavities of the WCW 500 accommodate individual pixels 1304. In addition, the wafer level packing may also include wire bonding areas (not shown) disposed adjacent each die. It should be appreciated, however, the exemplary WCW embodiments may be used with other types of semiconductor devices.

Figure 14:
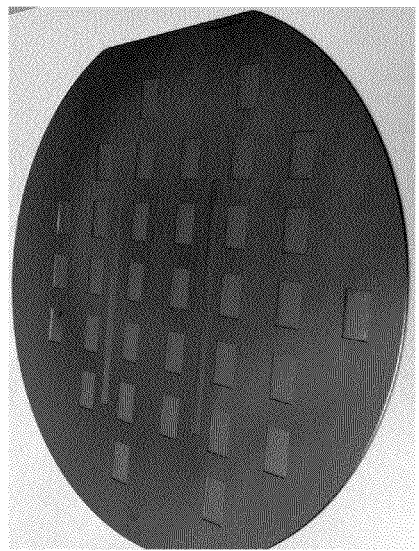
FIG. 14 is image of an exemplary silicon wafer having cavities machined therein, such as after the processing depicted in FIG. 1.

Among the technical benefits of the above described embodiments is the elimination of photolithography of a semiconductor cap substrate such as silicon, in so far as it relates to forming cavities of the cap structure. This includes not only lithography based DRIE that forms straight walled cavities, but also other types of lithography based etches (e.g., KOH) that form angled surface cavities as well. An image of an exemplary silicon wafer having cavities machined therein (such as after the processing in FIG. 1) is shown in FIG. 14. Here, the wafer has yet to go through the subsequent processing operations described earlier to make an optical WCW, such as optional oxide formation, binding to the optical substrate, grinding, etc. This in turn represents a significant process step reduction in WCW fabrication flow due to the elimination of photolithography for the cavity formation step. Moreover, in contrast to DRIE, a greater cavity depth can be achieved with relatively minor impact to cost or cycle time. Also, elimination of DRIE for cavity formation results in elimination of sites for contamination traps which can also degrade a vacuum. Beneficially, the resulting cap structure is structurally strong since the substrate is not perforated or thinned prior to bonding.

While the disclosure has been described with reference to a preferred embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A method of forming a window cap wafer (WCW) structure for semiconductor devices, the method comprising:
   machining a plurality of cavities into a front side of a first substrate using ultrasonic energy coupling with abrasive slurry to perform the machining, without the use of a photolithography process to pattern the cavities, wherein the plurality of cavities are initially machined to a depth of about 350-400 microns (μm);
   bonding the first substrate to a second substrate, at the front side of the first substrate; and
   removing a back side of the first substrate so as to expose the plurality of cavities, thereby defining the WCW structure comprising the second substrate and a plurality of vertical supports comprised of material of the first substrate.

2. The method of claim 1, further comprising forming an oxide layer on the first substrate prior to bonding to the second substrate.

3. The method of claim 1, wherein the vertical supports have a height of about 300 μm.

4. A method of forming a window cap wafer (WCW) structure for semiconductor devices, the method comprising:
   machining a plurality of cavities into a front side of a first substrate using ultrasonic energy coupling with abrasive slurry to perform the machining, without the use of a photolithography process to pattern the cavities;
   bonding the first substrate to a second substrate, at the front side of the first substrate; and
   removing a back side of the first substrate so as to expose the plurality of cavities, thereby defining the WCW structure comprising the second substrate and a plurality of vertical supports comprised of material of the first substrate;
   wherein the second substrate comprises an infrared (IR) transmissive material that is transmissive to IR radiation in a thermal imaging spectrum region.

5. The method of claim 4, wherein the second substrate comprises one or more of silicon, polysilicon, germanium, and glass.

6. The method of claim 5, wherein the first substrate comprises one or more of silicon, polysilicon, germanium, and glass.

7. A method of forming a window cap wafer (WCW) structure for semiconductor devices, the method comprising:
   machining a plurality of cavities into a front side of a first substrate using ultrasonic energy coupling with abrasive slurry to perform the machining, without the use of a photolithography process to pattern the cavities;
   forming a plurality of sub-wavelength antireflective structured (SAS) arrays on a second substrate;
   bonding the first substrate to the second substrate, at the front side of the first substrate, wherein locations of the SAS arrays on the second substrate correspond to locations of the cavities in the first substrate; and
   removing a back side of the first substrate so as to expose the plurality of cavities, thereby defining the WCW structure comprising the second substrate and a plurality of vertical supports comprised of material of the first substrate.

8. The method of claim 7, further comprising forming an oxide layer on the first substrate prior to bonding to the second substrate.

9. The method of claim 7, wherein the plurality of cavities are initially machined to a depth of about 350-400 microns (μm).

10. The method of claim 9, wherein the vertical supports have a height of about 300 μm.

11. The method of claim 7, wherein the second substrate comprises an infrared (IR) transmissive material.

12. The method of claim 11, wherein the second substrate is transmissive to IR radiation in a thermal imaging spectrum region.

13. The method of claim 11, wherein the second substrate comprises one or more of silicon, polysilicon, germanium, and glass.

14. The method of claim 13, wherein the first substrate comprises one or more of silicon, polysilicon, germanium, and glass.

15. The method of claim 7, further comprising bonding the WCW structure to a semiconductor substrate.

16. A method of forming a window cap wafer (WCW) structure for semiconductor devices, the method comprising:
   machining a plurality of cavities into a front side of a first substrate;
   forming a plurality of sub-wavelength antireflective structured (SAS) arrays on a second substrate;
   bonding the first substrate to the second substrate, at the front side of the first substrate, wherein locations of the SAS arrays on the second substrate correspond to locations of the cavities in the first substrate;
   removing a back side of the first substrate so as to expose the plurality of cavities, thereby defining the WCW structure comprising the second substrate and a plurality of vertical supports comprised of material of the first substrate; and
   bonding the WCW structure to a semiconductor substrate comprising a bolometer focal plane array (FPA).

* * * * *